(12) United States Patent
Feyh et al.

(10) Patent No.: US 9,233,842 B2
(45) Date of Patent: *Jan. 12, 2016

(54) PASSIVATION LAYER FOR HARSH ENVIRONMENTS AND METHODS OF FABRICATION THEREOF

(71) Applicant: Robert Bosch GmbH, Stuttgart (DE)

(72) Inventors: Ando Lars Feyh, Palo Alto, CA (US); Fabian Purkl, Palo Alto, CA (US); Andrew Graham, Redwood City, CA (US); Gary Yama, Mountain View, CA (US)

(73) Assignee: Robert Bosch GmbH, Stuttgart (DE)

( * ) Notice: Subject to any disclaimer, the term of this patent is extended or adjusted under 35 U.S.C. 154(b) by 0 days.

This patent is subject to a terminal disclaimer.

(21) Appl. No.: 14/201,247

(22) Filed: Mar. 7, 2014

(65) Prior Publication Data

US 2014/0264781 A1    Sep. 18, 2014

Related U.S. Application Data

(60) Provisional application No. 61/786,959, filed on Mar. 15, 2013.

(51) Int. Cl.
*H01L 21/31* (2006.01)
*B81C 1/00* (2006.01)
(Continued)

(52) U.S. Cl.
CPC ........ *B81C 1/00809* (2013.01); *H01L 23/3192* (2013.01); *B81C 2201/016* (2013.01); *H01L 21/02601* (2013.01); *H01L 21/3142* (2013.01); *H01L 45/146* (2013.01); *H01L 2924/0002* (2013.01)

(58) Field of Classification Search
CPC ............ H01L 45/146; H01L 21/02601; H01L 21/3142; B82Y 10/00; B82Y 30/00
USPC ........... 438/287, 382, 763; 257/411, 537, 636
See application file for complete search history.

(56) References Cited

U.S. PATENT DOCUMENTS

2007/0092989 A1* 4/2007 Kraus et al. ..................... 438/99
2007/0273280 A1  11/2007 Kim et al.
(Continued)

FOREIGN PATENT DOCUMENTS

KR    10-2009-0049736 A    5/2009

OTHER PUBLICATIONS

International Search Report and Written Opinion corresponding to PCT Application No. PCT/US2014/022180, mailed Jun. 20, 2014 (10 pages).

*Primary Examiner* — George Fourson, III
(74) *Attorney, Agent, or Firm* — Maginot Moore & Beck LLP

(57) ABSTRACT

A method of fabricating a passivation layer and a passivation layer for an electronic device. The passivation layer includes at least one passivation film layer and at least one nanoparticle layer. A first film layer is formed of an insulating matrix, such as aluminum oxide ($Al_2O_3$) and a first layer of a noble metal nanoparticle layer, such as a platinum nanoparticle layer, is deposited on the first film layer. Additional layers are formed of alternating film layers and nanoparticle layers. The resulting passivation layer provides a thin and robust passivation layer of high film quality to protect electronic devices, components, and systems from the disruptive environmental conditions.

20 Claims, 3 Drawing Sheets

(51) Int. Cl.
  *H01L 23/31*  (2006.01)
  *H01L 21/314* (2006.01)
  *H01L 45/00*  (2006.01)
  *H01L 21/02*  (2006.01)

(56) References Cited

U.S. PATENT DOCUMENTS

| | | |
|---|---|---|
| 2008/0237822 A1 | 10/2008 | Raravikar et al. |
| 2009/0173991 A1* | 7/2009 | Marsh et al. ............... 257/324 |
| 2009/0302365 A1* | 12/2009 | Bhattacharyya ............. 257/298 |
| 2010/0132762 A1 | 6/2010 | Graham, Jr. et al. |
| 2010/0264333 A1* | 10/2010 | Offermans et al. ......... 250/459.1 |
| 2011/0186799 A1* | 8/2011 | Kai et al. .......................... 257/3 |
| 2012/0282738 A1 | 11/2012 | Chen |
| 2013/0148126 A1* | 6/2013 | Walters et al. ............... 356/445 |
| 2014/0091281 A1* | 4/2014 | Cheng et al. .................... 257/39 |
| 2014/0197369 A1* | 7/2014 | Sheng et al. ..................... 257/4 |
| 2014/0264224 A1* | 9/2014 | Zhang et al. ..................... 257/2 |
| 2014/0264900 A1* | 9/2014 | Feyh et al. .................... 257/773 |

* cited by examiner

PASSIVATION LAYER FOR HARSH ENVIRONMENTS AND METHODS OF FABRICATION THEREOF This application claims the benefit of U.S. Provisional Application No. 61/786,959, filed Mar. 15, 2013, the entire disclosure of which is herein incorporated by reference.

TECHNICAL FIELD

This disclosure relates to electronic devices including integrated circuits and more particularly to a passivation layer for an integrated circuit.

BACKGROUND

The production of integrated circuits includes the formation of passivation layers which provide electrical stability by isolating certain features of the integrated circuits from undesirable electrical and chemical conditions. In general, a passivation layer is formed of silicon mononitride (SiN) or silicon carbide (SiC) as a thick film. These types of passivation layers, however, are only sufficient to act as barrier against certain environmental conditions. In the face of other environmental conditions, these types of passivation layers are not sufficiently robust to prevent the environmental conditions from affecting the integrated circuit. Consequently, thick films are not always a possible alternative when manufacturing certain types of integrated circuits.

In addition, the use of these types of passivation layers can influence the operation of the integrated circuit. For instance, the operation of a sensor fabricated as an integrated circuit is influenced. In addition, the described materials, SiN and SiC are only suitable, if the passivating film is of high quality. To achieve a high quality film, high deposition temperatures greater than five-hundred (500) degrees Celsius (C) are required. These temperatures are often not compatible with the device or circuit requiring protection.

Consequently, there is a need for a passivation layer for use in the fabrication of integrated circuits, electrical devices and components including micro-electrical mechanical systems (MEMS) devices.

SUMMARY

The present disclosure relates to the field of integrated circuit including microelectromechanical systems and devices, including micromachined systems and devices, configured to sense a wide variety of conditions including pressure, sound, and environmental conditions such as humidity. MEMS devices in different embodiments include sensors and actuators typically formed on or within a substrate such as silicon. Devices other than sensors can also benefit from the use of the described passivation layer and the method of fabricating a passivation layer. For instance, micromachined pressure sensors and accelerometers can also benefit. Consequently, the described passivation layer and method of manufacture improves the use and operability of integrated circuits, including sensors, pressure sensors and accelerometers, experiencing disruptive environmental conditions and often harsh environment conditions.

In addition, the passivation layer is provide for optical elements, as the layer can be extremely thin and due to its composite nature is very robust. Optical elements include among others touch screens, user interfaces, and lenses.

The described passivation layer and method of fabrication provides a thin and robust passivation layer of high film quality. In one embodiment, the passivation layer can be formed by using deposition temperatures of approximately less than three-hundred degrees (300) C. In another embodiment, the passivation layer is formed with the application of lower temperatures, as low as about one-hundred (100) degrees C. Therefore, the passivation layer in different embodiments is applied to all types of circuits and sensors. In addition, disposable devices, including for instance bio sensors and lab-on-a-chip devices which incorporate one or more laboratory functions on an integrated circuit incorporate the disclosed passivation layer in some embodiments. In addition, such devices including plastic incorporate the passivation layer. The film also is realized in a bio-compatible manner in some embodiments. The deposition method via atomic layer deposition allows extremely conformal deposition and allows protection of systems with high aspect-ratios/high topography.

A method of forming an electronic device in one embodiment includes forming a base portion including a sensor layer, forming a first insulating layer on an upper surface of the sensor layer using atomic layer deposition (ALD), depositing a first plurality of noble metal nanoparticles on an upper surface of the first insulating layer, and forming a second insulating layer on portions of the upper surface of the first insulating layer and on the first plurality of noble metal nanoparticles by ALD.

An electronic device in one embodiment includes a base portion, and a passivation layer on the sensor portion, the passivation layer including an insulating base layer formed by atomic layer deposition (ALD) on a surface of the base portion, a matrix of insulating material and noble metal nanoparticles formed on the base layer using ALD, and an insulating cap layer formed by ALD on the matrix.

DESCRIPTION

Figure 1:
FIG. 1 depicts a transmission electron microscope (TEM) image of an electronic device including a passivation layer with a matrix having a first thickness.

For the purposes of promoting an understanding of the principles of the disclosure, reference will now be made to the embodiments illustrated in the drawings and described in the following written specification. It is understood that no limitation to the scope of the disclosure is thereby intended. It is further understood that the present disclosure includes any alterations and modifications to the illustrated embodiments and includes further applications of the principles of the disclosure as would normally occur to one of ordinary skill in the art to which this disclosure pertains.

FIGS. 1-4 depict transmission electron microscope (TEM) images of an electronic device 100 including a passivation layer 102. The electronic device 100 includes a base portion 104 on which the passivation layer 102 is formed. While depicted as being formed on an upper surface of the base portion 104, the passivation layer 102 may be formed additionally and/or alternatively on sides of the base portion 104.

Figure 2:
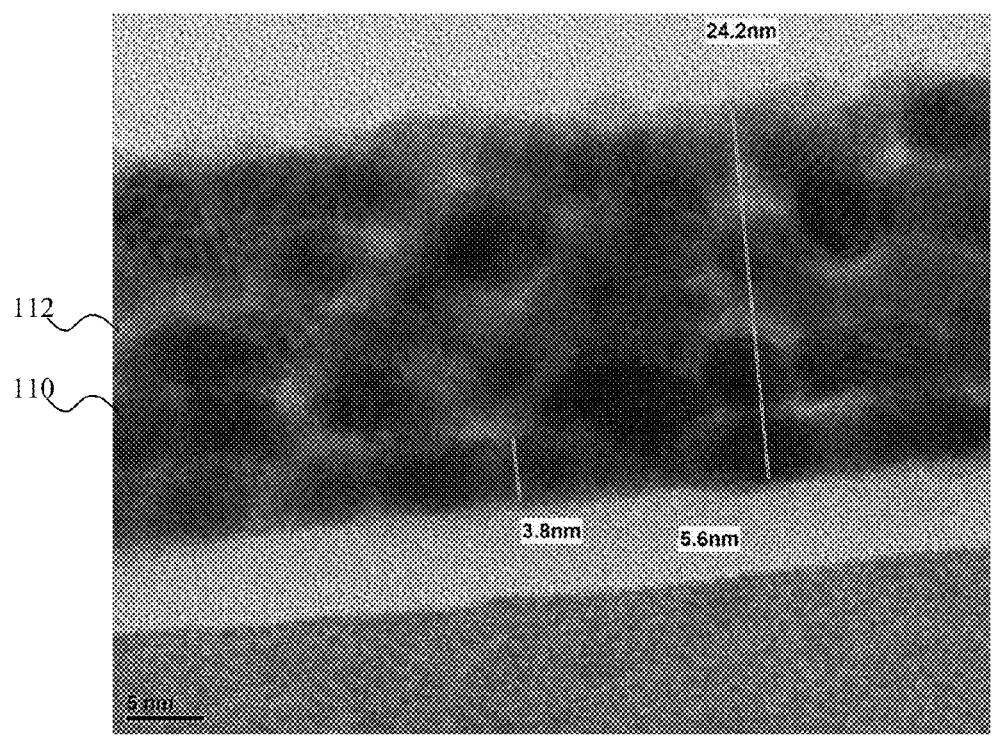
FIG. 2 shows a magnified view of the TEM image of FIG. 1 illustrating an insulating material portion and a nanoparticle portion of the matrix.

The passivation layer 102 includes a base layer 106 formed with an insulating material using a process such as ALD, although PVD is used in another embodiment. In the embodiment of FIGS. 1-2, the base layer 106 is of $Al_2O_3$ formed to provide a thickness on the order of 5-6 nm. In other embodiments, the base layer is a few angstroms in thickness.

Figure 3:
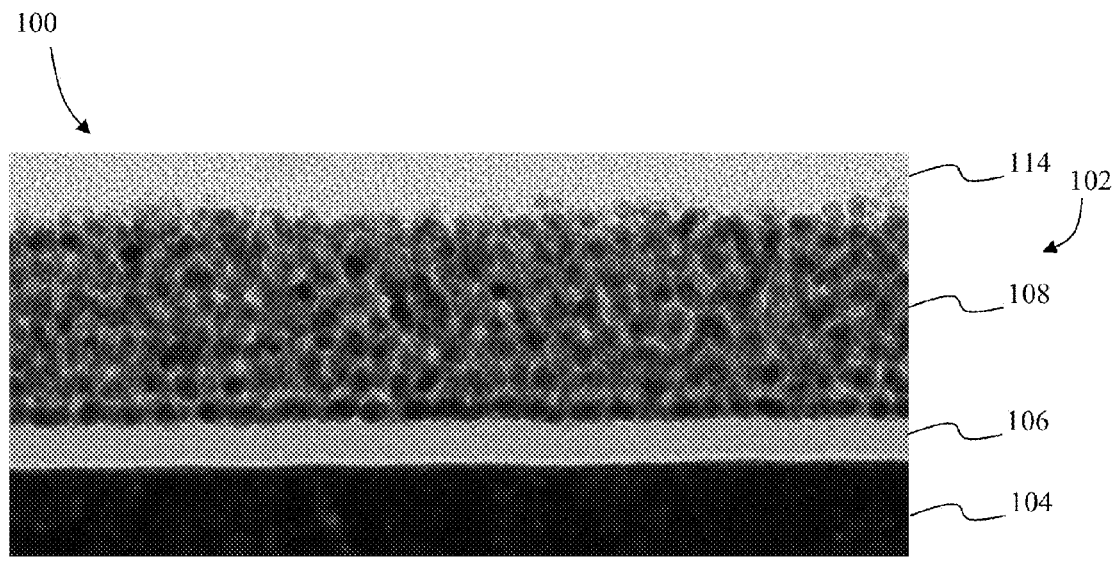
FIG. 3 depicts a TEM image of another electronic device including a passivation layer with a matrix having a second thickness.
Figure 4:
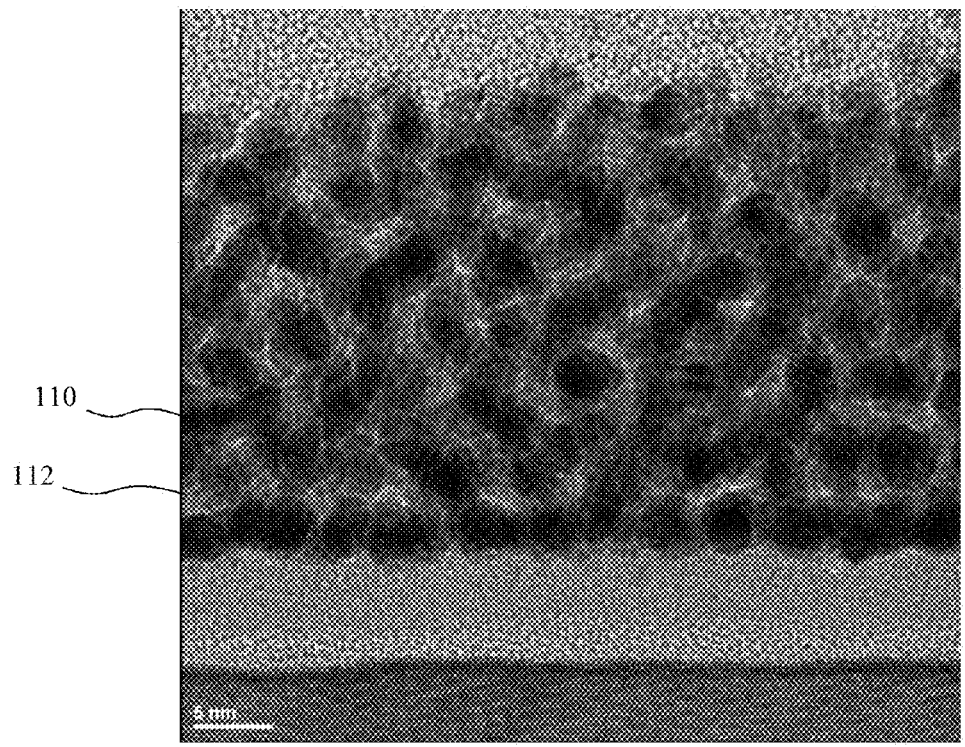
FIG. 4 shows a magnified view of the TEM image of FIG. 3 illustrating an insulating material portion and a nanoparticle portion of the matrix.

A matrix 108 including noble metal nanoparticles 110 (which appear as large dark circular objects, particularly in FIGS. 2-4) and insulating material 112 (which is similar in appearance to the base layer 106) is located above the base layer 106. In FIG. 2, five layers of noble metal nanoparticles 110 can be discerned. Each layer of nanoparticles is separated from the adjacent layer of nanoparticles by a layer of insulating material, resulting in four intermediate layers of insulating material. The noble metal nanoparticles 110 in this embodiment are platinum noble metal nanoparticles with a diameter of about 4 nm. The total thickness of the matrix 108 is about 24.2 nm. Accordingly, each layer of insulating material (like the layer 16) is about 1 nm in thickness.

In FIGS. 3 and 4, approximately seven layers of the noble metal nanoparticles 110 can be discerned. Similar to the layers of the nanoparticles shown in FIG. 2, each layer of the nanoparticles shown in FIGS. 3 and 4 is separated from the adjacent layer of nanoparticles by a layer of insulating material, resulting in six intermediate layers of insulating material. The noble metal nanoparticles 110 in this embodiment are similarly platinum noble metal nanoparticles with a diameter of about 4 nm. Accordingly, the total thickness of the matrix 108 shown in FIGS. 3 and 4 is greater than 24.2 nm.

In the embodiments of FIGS. 1-4, a cap layer 114 of insulating material is provided above the uppermost layer of noble metal nanoparticles. In some embodiments, the cap layer 114 is of similar thickness and material as the base layer 106. In other embodiments, the cap layer 114 is about the same thickness as the intermediate insulation layers, or thinner.

The passivation layer 104 prevents electrical short circuiting of different sensor/device areas. Platinum is described as being used as the noble metal nanoparticle in the foregoing example, but other noble metals such as gold (Au) are known to be extremely inert against harsh or disruptive environments such as those that are chemically aggressive. Accordingly, in other embodiments nanoparticles of other noble metal are used. In other embodiments using other noble metals, the nanoparticles are preferably substantially the same size as the platinum nanoparticles of FIGS. 1-4. Materials other than noble metal are also known to be resilient against harsh or disruptive environments. Accordingly, in other embodiments nanoparticles of material other than noble metal, such as Aluminum, Titanium, Titanium Nitride, Tungsten, and Ruthenium, are used. In addition, while $Al_2O_3$ is described as being used for the insulation material, in other embodiments other insulating materials, including Hafnium Oxide ($HfO_2$) and Zirconium Dioxide ($ZrO_2$), or combinations thereof, are used. The term "electronic device" is not meant to be limiting to any one specific device and includes devices such as a sensor, an integrated circuit, and an interposer. Accordingly, the term "base portion" as used herein can include any portion of a sensor, an integrated circuit, an interposer, or the like on which a passivation layer is formed.

Figure 5:
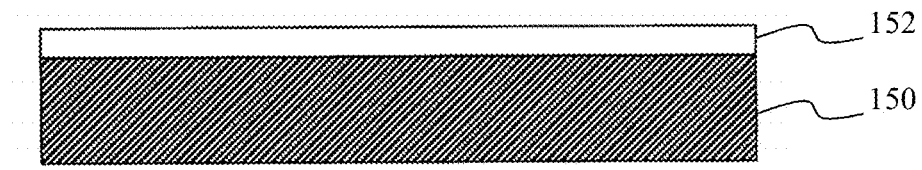
FIGS. 5-8 depict a process for forming a passivation layer on a base portion of an electronic device.

FIGS. 5-8 depict a process for forming a passivation layer on a base portion 150, which in one embodiment includes an outer layer of silicon. Referring initially to FIG. 5, a base layer 152 is deposited on the base portion 150. The base portion 150 in one embodiment is formed in accordance with any desired process. In some embodiments, the base portion 150 is an outer layer of the sensor area, or even a membrane of a sensor area.

The base layer 152 is a layer of insulating material. In one embodiment, the base layer 152 is a thin $Al_2O_3$ layer, having a thickness of a few Angstroms. In some embodiments, the base layer 152 is a few nanometers thick. The base layer 152 may be deposited on a base portion formed of a material such as silicon, adjacent to one or more conductors formed on the base portion. The base layer 152 provides a base layer of insulating material which substantially prevents electrical short circuiting of different areas of the devices being formed including MEMS sensors and accelerometers.

Figure 6:
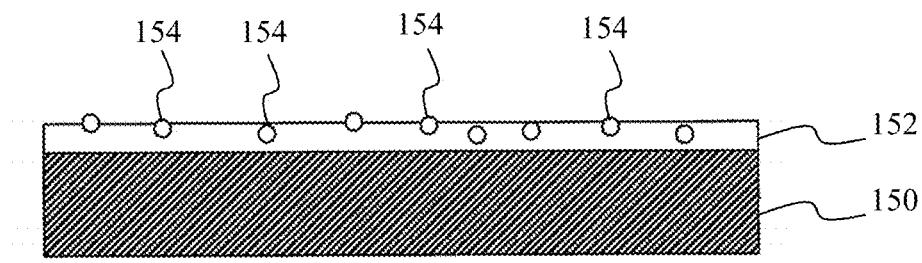

Formation of the passivation layer continues by using a switched process of atomic layer deposition (ALD). After the base layer of insulating material such as Aluminum Oxide ($Al_2O_3$) is deposited to form the base layer 152, a layer of noble metal nanoparticles 154 such as platinum (Pt) is deposited on the base layer 152 as illustrated in FIG. 6. The deposition process of the layer of noble metal nanoparticles 154 is controlled in a way that individual nanoparticles 154 are formed. In one embodiment, the nanoparticles 154 are Pt crystals. FIG. 6 is for illustrative purposes only and the circles representing the nanoparticles 154 do not represent an actual size of the nanoparticles with respect the thickness of the film 152, nor do the respective locations of the nanoparticles represent the distance between nanoparticles.

While the layer of noble metal nanoparticles 154 may be thicker than the base layer 152, the thickness of the layer of noble metal nanoparticles 154 is controlled to be less than the thickness at which the noble metal coalescences, for instance approximately four (4) nanometers for Pt. Consequently, individual nanoparticles are realized, not a continuous layer, once the process for depositing the layer of nanoparticles 154 is completed. Because the thickness of the layer of noble metal nanoparticles 154 is limited, if a different thickness is desired for a passivation layer, the above steps are repeated, as desired to obtain the desired thickness.

Figure 7:
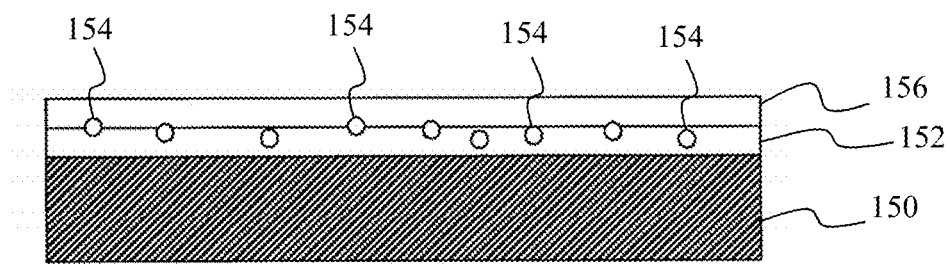
Figure 8:
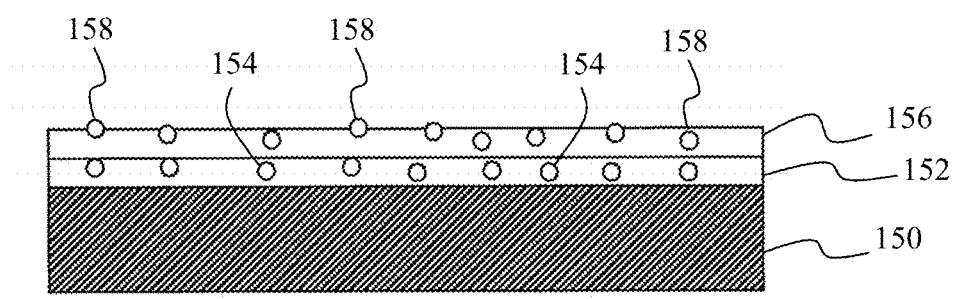

For example, as illustrated in FIG. 7, a second layer 156 of insulating material is deposited on the layer 152 and on the nanoparticles 154. If the thicker passivation layer is desired, a second layer of nanoparticles 158 such as platinum nanoparticles is deposited on the second layer 156 (see FIG. 8). The steps are thus repeated as needed to obtain the desired thickness. In some embodiments, a stack of four to fifty or more layers of insulating material and noble metals are used. In one embodiment, the final layer of insulating material is formed to be thicker than any of the intermediate insulating layers to form a cap layer such as the cap layer 114.

Because of the manner in which the various layers in the passivation layer are formed, it is possible to mix materials if desired for a particular application. For example, the different layers of insulation material may be formed using different materials and the different layers of noble metals may be formed with different metals.

The nature of the film allows a high protection of the underlying device against attack from harsh or disruptive environments. The platinum particles are chemically extremely inert and thereby not attacked. The insulating $Al_2O_3$ matrix is extremely thin, only 0.1-2 nm, and therefore a high aspect ratio structure is obtained, which allows good protection against attack.

Those of skill in the art will recognize that the process described with reference to FIGS. 5-8 in other embodiments is modified to provide a variety of configurations designed for the particular embodiment.

The passivation layer and devices which include the passivation layer of the present invention can be embodied in a number of different configurations. The following embodiments are provided as examples and are not intended to be limiting.

In one embodiment, a method is provided for fabricating a passivation layer for protection of devices against undesirable environments. The method in one embodiment has a low deposition temperature of less than three-hundred degrees C. In one embodiment, the method is implemented to fabricate complementary metal oxide semiconductor (CMOS) devices and sensors. The method in one embodiment has a deposition temperature of one-hundred degrees or lower so as to allow compatibility to bio-sensors and lab-on-chip systems.

In one embodiment, the passivation layer is formed of particles having a high chemical inertness due to utilization of noble metal nanoparticles, including platinum or gold. The method in one embodiment includes an electrically insulating film of platinum-nanoparticles realized by enclosing the particles within an insulating matrix including $Al_2O_3$, $HfO_2$, $ZrO_2$, or combinations thereof. In one embodiment, the method includes fabricating the passivation layer by use of an ALD process. In one embodiment, the method includes passivation of packaged electronic devices, as a highly conformal deposition process. The method in one embodiment includes passivation of bond-wires and/or passivation of high aspect-ratio structures including micro-fluidic systems.

In one embodiment, the method includes a passivation layer having a total film thickness less than 100 nm. The method in another embodiment includes a passivation layer having a total film thickness below 50 nm. In one embodiment, the method includes a passivation layer formed as an optically transparent film, including a low thickness. The method in one embodiment includes a passivation layer for applications in systems with optical detection/readout.

The passivation layer described above does not limit to materials including nanoparticles made from noble metals. Other type of materials such as Aluminum, Titanium, Titanium Nitride, Tungsten, Ruthenium are also possible, depending on the application.

While the disclosure has been illustrated and described in detail in the drawings and foregoing description, the same should be considered as illustrative and not restrictive in character. The passivation layer can be incorporated in a wide range of devices. It is understood that only the preferred embodiments have been presented and that all changes, modifications and further applications that come within the spirit of the disclosure are desired to be protected.

What is claimed is:

1. A method of forming an electronic device, comprising:
   forming a base portion;
   forming a passivation layer, including:
      forming a first insulating layer on an upper surface of the base portion using atomic layer deposition (ALD);
      depositing a first plurality of nanoparticles on an upper surface of the first insulating layer; and
      forming a second insulating layer on portions of the upper surface of the first insulating layer and on the first plurality of nanoparticles by ALD,
   wherein the base portion and the first insulating layer are configured to preclude transfer of electricity therethrough.

2. The method of claim 1, wherein the second insulating layer is a type of insulating material different from a type of insulating material of the first insulating layer.

3. The method of claim 1, wherein depositing the first plurality of nanoparticles comprises:
   depositing a first plurality of nanoparticles to a thickness less than a coalescence thickness of the first plurality of nanoparticles.

4. The method of claim 1, wherein forming the passivation layer further comprises:
   depositing a second plurality of nanoparticles above the second insulating layer; and
   forming a third insulating layer on portions of the upper surface of the second insulating layer and on the second plurality of nanoparticles by ALD.

5. The method of claim 4, wherein the second plurality of nanoparticles is a type of material different from a type of material of the first plurality of nanoparticles.

6. The method of claim 1, wherein the passivation layer is formed at a deposition temperature of less than 300° C.

7. The method of claim 1, wherein:
   forming the first insulating layer comprises forming the first insulating layer at a deposition temperature of less than 100° C.;
   depositing the first plurality of nanoparticles comprises depositing the first plurality of nanoparticles at a deposition temperature of less than 100° C.; and
   forming the second insulating layer comprises forming the second insulating layer at a deposition temperature of less than 100° C.

8. The method of claim 1, wherein:
   depositing the first plurality of nanoparticles comprises depositing a first plurality of noble metal nanoparticles.

9. The method of claim 1, wherein:
   forming the first insulating layer comprises forming a first insulating layer of aluminum oxide ($Al_2O_3$), hafnium oxide ($HfO_2$), or zirconium dioxide ($ZrO_2$) on the upper surface of the base portion using ALD; and
   forming the second insulating layer comprises forming a second insulating layer of aluminum oxide ($Al_2O_3$), hafnium oxide ($HfO_2$), or zirconium dioxide ($ZrO_2$) on the portions of the upper surface and on the first plurality of noble metal nanoparticles by ALD.

10. The method of claim 1, wherein forming the passivation layer further comprises:
    determining a desired thickness of the passivation layer to protect the electronic device against harsh or disruptive environments; and
    alternatively depositing additional nanoparticles and forming additional insulating layers above the third insulating layer until a combined thickness of the first insulating layer, first plurality of nanoparticles, second insulating layer, additional nanoparticles, and additional insulating layers is at the desired thickness.

11. The method of claim 10, wherein:
    the first insulating layer has a thickness greater than 3 nm, measured as the shortest distance from the upper surface of the base portion to the first plurality of nanoparticles, and
    the desired thickness of the passivation layer is approximately 50 nm.

12. The method of claim 1, wherein the nanoparticles are noble metal nanoparticles.

13. An electronic device, comprising:
    a base portion; and
    a passivation layer on the base portion, the passivation layer including
       an insulating base layer formed by atomic layer deposition (ALD) on a surface of the base portion,
       a matrix of insulating material and nanoparticles formed on the base layer using ALD, and
       an insulating cap layer formed by ALD on the matrix, wherein the base portion and the insulating base layer are configured to preclude transfer of electricity therethrough.

14. The electronic device of claim 13, wherein the matrix comprises:
a first plurality of nanoparticles on the base layer;
a first insulating layer between the first plurality of nanoparticles and the cap layer; and
a second plurality of nanoparticles between the first insulating layer and the cap layer.

15. The electronic device of claim 14, wherein the second plurality of nanoparticles is a type of material different from a type of material of the first plurality of nanoparticles.

16. The electronic device of claim 14, wherein the first insulating layer is a type of insulating material different from a type of insulating material of the base layer.

17. The electronic device of claim 13, wherein the nanoparticles are deposited in a layer having a thickness below a coalescence thickness of the nanoparticles.

18. The electronic device of claim 17, wherein the nanoparticles are noble metal nanoparticles.

19. The electronic device of claim 18, wherein the noble metal nanoparticles are platinum nanoparticles.

20. The electronic device of claim 17, wherein the base layer is formed with an insulating material selected from the group comprising:
aluminum oxide ($Al_2O_3$);
hafnium oxide ($HfO_2$); and
zirconium dioxide ($ZrO_2$).

* * * * *